United States Patent [19]

Miura et al.

[11] 4,065,754
[45] Dec. 27, 1977

[54] INPUT DEVICE FOR PROCESSING SYSTEM PROBE CONTROLLED

[75] Inventors: Genmei Miura, Tokyo; Kanou Takeshita, Yokohama, both of Japan

[73] Assignee: Canon Kabushiki Kaisha, Tokyo, Japan

[21] Appl. No.: 650,007

[22] Filed: Jan. 19, 1976

[30] Foreign Application Priority Data

Jan. 22, 1975 Japan .................. 50-9531

[51] Int. Cl.² .............................................. G06F 3/14
[52] U.S. Cl. ........................... 340/166 R; 340/324 M
[58] Field of Search ............... 340/324 M, 337, 172.5, 340/166 R

[56] References Cited
U.S. PATENT DOCUMENTS

| | | | |
|---|---|---|---|
| 3,389,404 | 6/1968 | Koster | 340/172.5 |
| 3,399,401 | 8/1968 | Ellis | 340/172.5 |
| 3,469,242 | 9/1969 | Eachus | 340/172.5 |
| 3,543,240 | 11/1970 | Miller | 340/172.5 |
| 3,668,654 | 6/1972 | Doersam | 340/172.5 |
| 3,768,073 | 10/1973 | Rawson | 340/324 M |

*Primary Examiner*—Harold I. Pitts
*Attorney, Agent, or Firm*—Fitzpatrick, Cella, Harper & Scinto

[57] ABSTRACT

In an input device, a scanning pulse is supplied in time division fashion to a plurality of switching means effecting information input indications. The scanning pulse applied to the driven switching means is detected by a probe to stop the operation of address means which varies its contents in accordance with the scanning pulse. The content of the address means during the stoppage thereof are indicated as input information on the driven switching means.

7 Claims, 3 Drawing Figures

INPUT DEVICE FOR PROCESSING SYSTEM PROBE CONTROLLED

BACKGROUND OF THE INVENTION

1. Field of the Invention

This invention relates to an input device for entering information into a data processor, and particularly to an input device in which switching means are arranged at points of intersections in a matrix and a scanning pulse is supplied to the column lines or the row lines of the matrix so that a signal provided by the driven switching means may be used to generate the information corresponding to that switching means.

2. Description of the Prior Art

The input device heretofore used with a data processor has usually been such that a matrix comprising conductive members arrayed in columns and rows is provided and switching means are connected at point of intersections between the column lines and the row lines of such matrix, whereby a pulse is supplied from a signal generator to the column or the row lines of the matrix to decode the pulse provided by the driven switching means and cause an encoder to generate a coded signal corresponding to that switching means.

Such an input device, however, has required the circuit for decoding the signals provided by the switching means and the encoder to be complicated in accordance with the increase in types of information to be entered.

SUMMARY OF THE INVENTION

It is an object of the present invention to eliminate the above-noted drawbacks and to provide an input device which may be simplified to construct.

It is another object of the present invention to provide an input device which may be made compact.

It is still another object of the present invention to provide an input device which permits the number of mechanical components to be reduced.

Other objects of the present invention will become apparent from the following detailed description of embodiments thereof taken in conjunction with the accompanying drawings.

DESCRIPTION OF THE PREFERRED EMBODIMENTS

Figure 1:
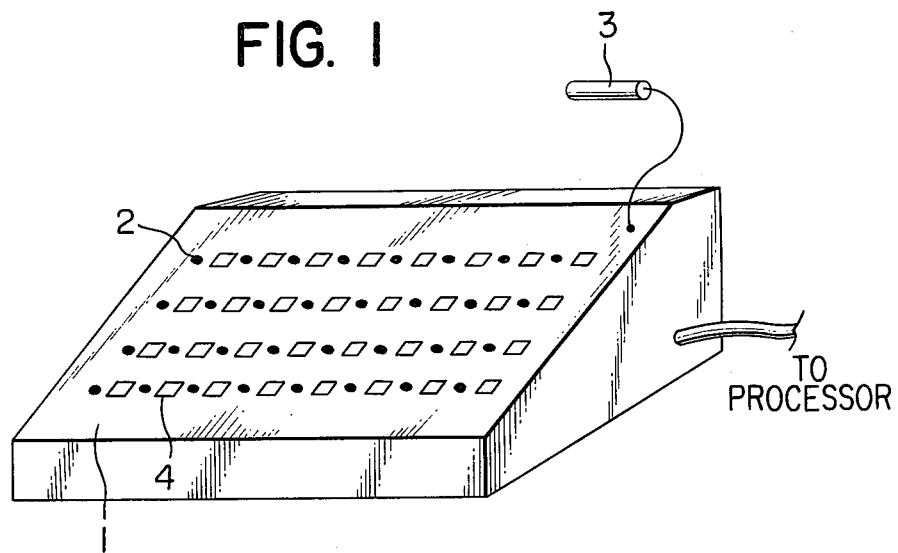
FIG. 1 is a pictorial view showing an embodiment of the input device according to the present invention.

Referring to FIG. 1 which is a pictorial view showing an embodiment of the input device according to the present invention, there is disposed on an operating panel 1 signal generating and switching means driven in time division fashion, for example, light-emitting diodes 2, and detector means such as light pen 3 is provided to detect the time-division driving of such light-emitting diodes 2 to produce a detection signal which provides a digital signal corresponding to that light-emitting diode 2 whose light emission has ben detected, said digital signal being used as an information signal to be entered into another processor. Disposed adjacent to each light-emitting diode 2 on the operating panel is an indicator plate 4 for indicating the content of the information delivered to the processor upon detection of the light emission of the light-emitting diode 2.

Figure 2:
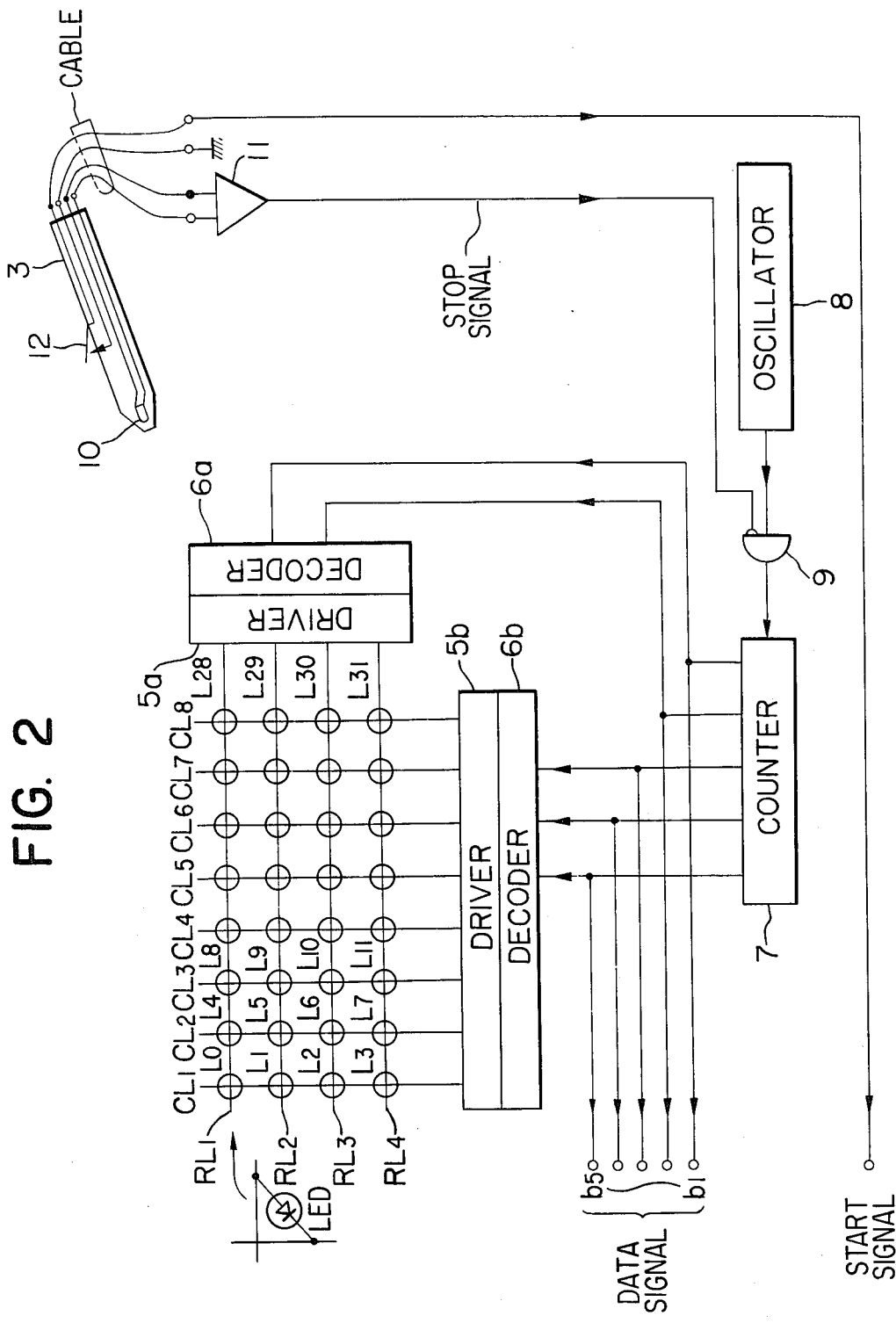
FIG. 2 is a diagram of the electric circuit in the embodiment shown in FIG. 1.

FIG. 2 is a diagram of the electric circuit in the input device shown in FIG. 1. In the figure, column lines $CL_1$–$CL_8$ and row lines $RL_1$–$RL_4$ together constitute a matrix. Light-emitting diodes $L_0$–$L_{31}$ which are switching elements are connected at the points of intersection between the column lines $CL_1$–$CL_8$ and the row lines $RL_1$–$RL_4$, as shown, and constitute a matrix circuit.

Decoder circuits 6a and 6b, composed of diodes or MOS transistors, are connected through drivers 5a and 5b comprising semiconductors, so that the signal for driving each light-emitting diode in time division fashion may be supplied from one end of the matrix circuit.

The decoder circuits 6a and 6b are connected so that they may be supplied with a signal from count means which may herein be a 5-bit counter 7 presenting thirty-two states inasmuch as thirty-two light-emitting diodes 2 are arranged on the operating panel.

Although the count means is shown as a counter, it is possible to replace the count means by a combination of a register, an adder and a signal generator so that the output of the register may be applied to one end of the adder and the output of the signal generator to the other end of the adder, the output of which may be entered into the register, whereby the content of the register may be incrementally increased or decreased.

The counter 7 receives as input a pulse supplied from an oscillator 8 through a gate 9 and such pulse causes the counter to advance its count stepwisely. The light pen for detecting the light emission of the light-emitting diodes driven in time division fashion is provided with, for example, a photodiode 10 as detector means, which photodiode 10 detects the light emission of the light-emitting diodes 2, and the detection signal is delivered to an amplifier 11 to close the gate 9 and thereby stop the stepwise advance of the counter 7. As soon as the counter 7 stops its stepwise advance, the decoder circuits 6a, 6b and the drivers 5a, 5b maintain their outputs unchanged so that the selected one of the light-emitting diodes $L_0$–$L_{31}$ emits light at 100% duty. When a switch 12 is driven, there is generated a start signal which opens a gate or the like (not shown) to permit the content of the counter 7, namely, a digital signal corresponding to the detected diode, to be applied as input to the processor.

If the switch 12 used is of the type which is turned on and off, there may be provided a detector circuit and a delay circuit so as to detect the driving of the switch and generate a start signal after a predetermined time.

Operation of the embodiment constructed as described will now be discussed.

Figure 3:
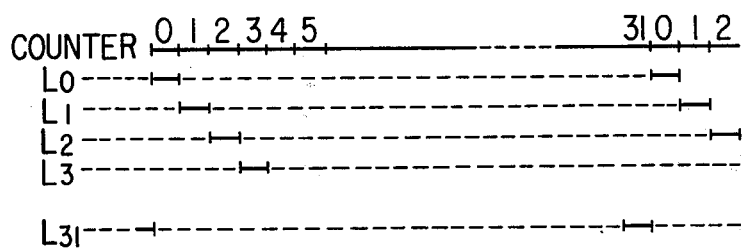
FIG. 3 illustrates the operation of the circuit shown in FIG. 2.

The counter 7 usually stepwisely advances its content by the pulse from the oscillator 8 and the output of the counter 7 is supplied through the decoder circuit 6a, 6b and drivers 5a, 5b to the matrix circuit having the light-emitting diodes $L_0$–$L_{31}$ arranged therein. FIG. 3 shows an example of the time division driving of the light-emitting diodes $L_0$–$L_{31}$, and illustrates the waveform in which the light-emitting diodes $L_0, L_1, \ldots L_{31}$ shown in FIG. 2 are successively turned on in the order of their suffix numbers.

If the light pen 3 approaches one of the so driven light-emitting diodes $L_0$–$L_{31}$, for example, the diode $L_3$, detection of this light-emitting diode $L_3$ will occur upon driving thereof and the detection signal will be amplified by the amplifier 11 to close the gate 9 and stop the stepwise advance of the counter 7, so that the light-emitting diode $L_3$ will emit light at 100% duty. At the same time, the output of the counter 7 will appear on output lines $b_1$–$b_5$ and when the switch 12 is depressed, the content of the counter 7 will enter into the processor through a gate (not shown) adapted to be opened upon depression of the switch 12.

In the time division driving of the light-emitting diodes, if the driving time of the light-emitting diodes are determined so that any after-image of the turn-on is not sensed by the eyes, as by causing the oscillator to rapidly drive the counter or by increasing the number of the light-emitting diodes so that the whole will not maintain a statically turned on state, then the selected light-emitting diode will turn on at 100% duty upon generation of the digital signal to enable the operator to make sure of the signal generation by sight. Also, the mixed use of dynamic drive and static drive as described will lead to economy of the electric power consumption.

Although the invention has been described with respect to an embodiment which uses light as medium it will readily be appreciated that the invention is equally applicable to those constructions which use other medium, for example, sound or the like.

As alternative embodiments, manually driven switches may be disposed at the points of intersection in the matrix, the pulse applied from column lines $CL_1$–$CL_8$ may be received by row lines $RL_1$–$RL_4$ or the gate may be opened by a signal provided upon application of the output of the decoder 6b and the output of the counter may be supplied to another processor.

According to the present invention, as has hitherto been described, the signal provided by signal generator means driven in time division fashion may be detected and the detection signal is used to generate a digital signal, and this enables realization of a compact input device which is reliable in operation and simple in construction.

What is claimed is:

1. An input device for entering selected items of information into a processing system, comprising:
    a plurality of conductors defining a matrix having intersecting row and column lines, each intersection of a row line and a column line corresponding to one of said items of information;
    a plurality of indication means each one of which is coupled to a respective row and column line at corresponding intersections, wherein an indication signal is produced by each of said indication means in response to energization to corresponding row and column lines;
    address means for generating address signals for application to sequentially energize each one of said indication means and to store a selected one of said address signals;
    matrix driving means coupled to said address means and said conductors for selectively energizing each one of said indication means in response to the address signals applied by said address means;
    probe means coupled to said address means and movably disposed to detect the energization of a selected one of said indication means and for producing a detection output signal;
    inhibit means coupled to said probe means and said address means for halting continued sequential application the address signals produced by said address means in response to the detection output signal, wherein the address signal corresponding to the selected indication means is stored in said address means; and
    means coupled to said address means for deriving stored address signals for entry into the processing system as said selected items of information.

2. An input device according to claim 1, wherein said probe means is manually movable for selecting a particular one of said indication means.

3. An input device according to claim 1, wherein said indication means comprises electro-luminescent diodes.

4. An input device according to claim 1, wherein said probe means includes means for varying the driving duty ratio of the selected indication means upon detection of the corresponding indication signal from said selected indication means.

5. An input device for entering selected items of information into a processing system, comprising:
    a plurality of conductors defining a matrix having intersecting row and column lines, each intersection of a row line and a column line corresponding to one of said items of information;
    a plurality of electro-luminescent diodes each one of which is coupled to a respective row and column line at corresponding intersections wherein each diode produces a visual indication in response to energization of corresponding row and column lines;
    a counter having a counting capacity corresponding to the number of said diodes, the contents of the counter being incrementally varied in a predetermined sequence;
    matrix driving means coupled to said counter and said conductors for decoding the contents of the counter and for producing address signals operative to selectively energize said diodes;
    probe means coupled to said counter and movably disposed to detect a selected diode energized in response to one of the address signals from said matrix driving means and for producing a detection output signal;
    inhibit means coupled to said probe means and said counter for halting continued incremental variation of the contents in said counter in response to the detection output signal, wherein the count which corresponds to the selected diode is held by said counter; and
    means coupled to said counter for deriving the held count for entry into the processing system as the selected item of information.

6. An input device for entering selected information into a processing system, comprising:
    a plurality of indication signal generating means for generating respective indication signals;
    driving means coupled to each of said indication signal generating means for producing actuation signals operative to energize each of said indication signal generating means in a predetermined sequence and for storing the actuation signals;
    probe means coupled to said driving means and movably disposed to detect a selected indication signal from said signal generating means and for producing a detection output signal;
    inhibit means coupled to said probe means and said driving means for halting continued sequential variation of the actuation signals from the driving means in response to the detection output signal wherein the actuation signal which corresponds to the indication signal detected by said probe means is stored in th driving means; and means coupled to said driving means for deriving stored actuation signals for entry into the processing system as said selected information.

7. An input device according to claim 6, wherein said indication signal generating means comprises electroluminescent diodes.

* * * * *

UNITED STATES PATENT AND TRADEMARK OFFICE
CERTIFICATE OF CORRECTION

PATENT NO. : 4,065,754
DATED : December 27, 1977
INVENTOR(S) : GENMEI MIURA and KANOU TAKESHITA It is certified that error appears in the above–identified patent and that said Letters Patent are hereby corrected as shown below:

Column 3, Claim 1, line 52, delete "to" (second occurrence) and insert --of--.

Column 5, line 3, delete "th" and insert --the--.

Signed and Sealed this

Twenty-third Day of May 1978

[SEAL]

Attest:

RUTH C. MASON
*Attesting Officer*

LUTRELLE F. PARKER
*Acting Commissioner of Patents and Trademarks*